US008760831B2

(12) United States Patent
Abou-Khalil et al.

(10) Patent No.: US 8,760,831 B2
(45) Date of Patent: Jun. 24, 2014

(54) BI-DIRECTIONAL BACK-TO-BACK STACKED SCR FOR HIGH-VOLTAGE PIN ESD PROTECTION, METHODS OF MANUFACTURE AND DESIGN STRUCTURES

(71) Applicant: International Business Machines Corporation, Armonk, NY (US)

(72) Inventors: Michel J. Abou-Khalil, Essex Junction, VT (US); Robert J. Gauthier, Hinesburg, VT (US); Tom C. Lee, Essex Junction, VT (US); Junjun Li, Williston, VT (US); Souvick Mitra, Essex Junction, VT (US); Christopher S. Putnam, Hinesburg, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/762,948

(22) Filed: Feb. 8, 2013

(65) Prior Publication Data

US 2013/0161687 A1 Jun. 27, 2013

Related U.S. Application Data

(62) Division of application No. 12/898,013, filed on Oct. 5, 2010, now Pat. No. 8,503,140.

(51) Int. Cl.
*H02H 9/04* (2006.01)
*H01L 29/66* (2006.01)
*H01L 27/02* (2006.01)
*H01L 29/747* (2006.01)
*H01L 29/87* (2006.01)

(52) U.S. Cl.
CPC .......... *H01L 27/0262* (2013.01); *H01L 29/747* (2013.01); *H01L 29/87* (2013.01); *H02H 9/04* (2013.01)
USPC .............................................. 361/56; 257/121

(58) Field of Classification Search
CPC ... H01L 27/0262; H01L 29/747; H01L 29/87; H02H 9/04
USPC .............................................. 361/56; 257/121
See application file for complete search history.

(56) References Cited

U.S. PATENT DOCUMENTS 5,500,546 A   3/1996  Marum et al.
5,663,860 A * 9/1997  Swonger ..................... 361/56

(Continued)

FOREIGN PATENT DOCUMENTS

GB          1161248        8/1969

OTHER PUBLICATIONS

International Search Report of the International Searching Authority for Appl. No. PCT/US2011/051500, mailing date Feb. 29, 2012.

(Continued)

*Primary Examiner* — Scott Bauer
(74) *Attorney, Agent, or Firm* — Anthony Canale; Roberts Mlotkowski Safran & Cole, P.C.

(57) ABSTRACT

Bi-directional back-to-back stacked SCRs for high-voltage pin ESD protection, methods of manufacture and design structures are provided. The device includes a symmetrical bi-directional back-to-back stacked silicon controlled rectifier (SCR). An anode of a first of the back-to-back stacked SCR is connected to an input. An anode of a second of the back-to-back stacked SCR is connected to ground. Cathodes of the first and second of the back-to-back stacked SCR are connected together. Each of the symmetrical bi-directional back-to-back SCRs include a pair of diodes directing current towards the cathodes which, upon application of a voltage, become reverse biased effectively and deactivating elements from one of the symmetrical bi-directional back-to-back SCRs while the diodes of another of the symmetrical bi-directional back-to-back SCRs direct current in the same direction as the reverse biased diodes.

20 Claims, 6 Drawing Sheets

(56) References Cited

U.S. PATENT DOCUMENTS

| | | | |
|---|---|---|---|
| 5,717,559 | A | 2/1998 | Narita |
| 5,856,214 | A * | 1/1999 | Yu ................................ 438/133 |
| 5,903,415 | A | 5/1999 | Gill |
| 6,011,681 | A | 1/2000 | Ker et al. |
| 6,501,630 | B1 | 12/2002 | Colclaser et al. |
| 6,580,591 | B2 | 6/2003 | Landy |
| 6,594,132 | B1 | 7/2003 | Avery |
| 6,784,029 | B1 | 8/2004 | Vashchenko et al. |
| 6,936,896 | B2 | 8/2005 | Ida et al. |
| 6,964,883 | B2 | 11/2005 | Chang |
| 6,992,602 | B2 | 1/2006 | Alexander et al. |
| 7,009,404 | B2 | 3/2006 | Wendel et al. |
| 7,098,509 | B2 | 8/2006 | Zdebel et al. |
| 7,239,153 | B2 | 7/2007 | Nysaether |
| 7,342,282 | B2 | 3/2008 | O et al. |
| 7,394,133 | B1 | 7/2008 | Vashchenko et al. |
| 7,394,638 | B2 | 7/2008 | Ahmad et al. |
| 7,414,287 | B2 | 8/2008 | Pendharkar et al. |
| 7,485,930 | B2 | 2/2009 | Lee et al. |
| 7,541,889 | B2 | 6/2009 | Maloney |
| 7,639,464 | B1 | 12/2009 | Vashchenko et al. |
| 7,643,258 | B2 | 1/2010 | Lai et al. |
| 2003/0006776 | A1 | 1/2003 | Wendel et al. |
| 2004/0207021 | A1 * | 10/2004 | Russ et al. ................... 257/355 |
| 2005/0089200 | A1 | 4/2005 | Nysaether |
| 2005/0162791 | A1 | 7/2005 | Ahmad et al. |
| 2005/0205938 | A1 * | 9/2005 | Yagishita ..................... 257/369 |
| 2006/0043487 | A1 | 3/2006 | Pauletti et al. |
| 2007/0069310 | A1 | 3/2007 | Song et al. |
| 2007/0279824 | A1 | 12/2007 | Mallikararjunaswamy |
| 2008/0037182 | A1 | 2/2008 | Albrecht et al. |
| 2008/0116480 | A1 | 5/2008 | Glenn et al. |
| 2008/0282015 | A1 * | 11/2008 | Bueti et al. .................... 710/313 |
| 2008/0309394 | A1 | 12/2008 | Steinhoff |
| 2009/0052214 | A1 | 2/2009 | Edo et al. |
| 2009/0090972 | A1 | 4/2009 | Vinson |
| 2009/0101937 | A1 | 4/2009 | Lee et al. |
| 2009/0237847 | A1 | 9/2009 | Ryu et al. |
| 2009/0315146 | A1 | 12/2009 | Vashchenko et al. |
| 2010/0155775 | A1 | 6/2010 | Gauthier et al. |

OTHER PUBLICATIONS

Written Opinion of the International Searching Authority for Appl. No. PCT/US2011/051500, mailing date Feb. 29, 2012.

Bo et al., "A novel dual SCR device for ESD protection", IEEE 8th International Conference for ASIC, ASICON '09, 2009, pp. 789-791.

Ker et al., "Overview of On-Chip Electrostatic Discharge Preotection Design . . . in CMOS Integrated Circuits". IEEE Trans Dev Mat Rel, vol. 5, 2005, pp. 235-249.

Vashchenko et al., "Multi-Port ESD Protection Using Bi-Directional SCR Structures", Proc. 2003, Bipolar/BiCMOS Cir and Tech Mtg., 2003, pp. 137-140.

Wang et al., "On a Dual-Polarity On-Chip Electrostatic Discharge Protection Structure", IEEE Tran on Elec. Dev., vol. 48, No. 5, May 2001, pp. 978-984.

* cited by examiner

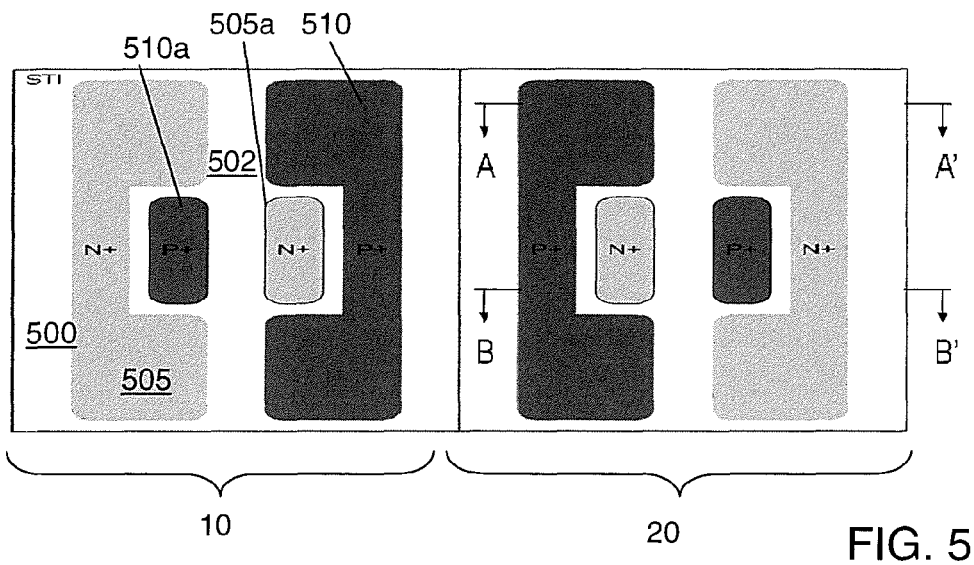
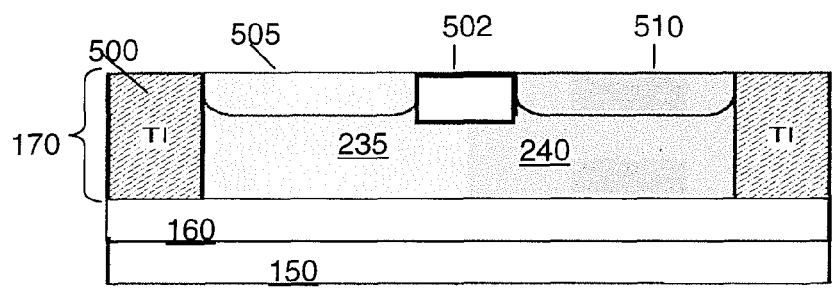
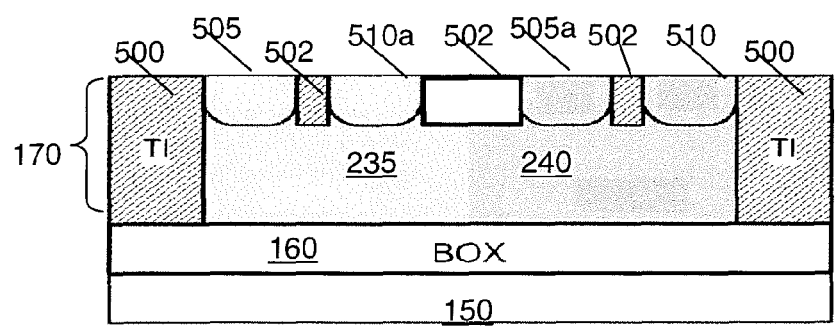

US 8,760,831 B2

BI-DIRECTIONAL BACK-TO-BACK STACKED SCR FOR HIGH-VOLTAGE PIN ESD PROTECTION, METHODS OF MANUFACTURE AND DESIGN STRUCTURES

FIELD OF THE INVENTION

The invention relates to semiconductor structures and methods of manufacture and, more particularly, to bi-directional back-to-back stacked SCRs for high-voltage pin ESD protection, methods of manufacture and design structures.

BACKGROUND

Electrostatic discharge (ESD) protection is becoming ever more important as integrated circuits become smaller and smaller. There are several ways in which to provide ESD protection, each having their own advantages and disadvantages. For example, ESD can be provided by a silicon controlled rectifier (SCR). A SCR is a solid state switching device that turns current on and off.

A semiconductor diode's behavior in a circuit is given by its current-voltage characteristic. The shape of the curve is determined by the transport of charge carriers through the so-called depletion layer or depletion region that exists at the p-n junction between differing semiconductors. The width of the depletion region cannot grow without limit. If an external voltage is placed across the diode with the same polarity as the built-in potential, the depletion zone continues to act as an insulator, preventing any significant electric current flow. This is the reverse bias phenomenon. However, if the polarity of the external voltage opposes the built-in potential, recombination can once again proceed, resulting in substantial electric current through the p-n junction (i.e., substantial numbers of electrons and holes recombine at the junction). At very large reverse bias, beyond the peak inverse voltage, a process called reverse breakdown occurs. This causes a large increase in current (i.e., a large number of electrons and holes are created at, and move away from the pn junction) that usually damages the device permanently.

Accordingly, there exists a need in the art to overcome the deficiencies and limitations described hereinabove.

SUMMARY

In a first aspect of the invention, a device comprises a symmetrical bi-directional back-to-back stacked silicon controlled rectifier (SCR). An anode of a first of the back-to-back stacked SCR is connected to an input. An anode of a second of the back-to-back stacked SCR is connected to ground. Cathodes of the first and second of the back-to-back stacked SCR are connected together. Each of the symmetrical bi-directional back-to-back SCRs include a pair of diodes directing current towards the cathodes which, upon application of a voltage, become reverse biased effectively and deactivating elements from one of the symmetrical bi-directional back-to-back SCRs while the diodes of another of the symmetrical bi-directional back-to-back SCRs direct current in the same direction as the reverse biased diodes.

In another aspect of the invention, a structure comprises a silicon controlled rectifier (SCR). The SCR comprises an N+ region and a P+ region formed in an N-well; and an N+ region and a P+ region formed in a P-well which is adjacent to the N-well. A diode comprises a portion of the N+ region formed in the N-well located adjacent to a portion of the P+ region formed in the P-well.

In yet another aspect of the invention, a method comprises in a first portion: forming trench isolation structures using lithographic, etching and deposition processes in an upper layer of a silicon on insulator substrate (SOI); forming contiguous a N-well and P-well in the upper layer bounded by the trench isolation structures; and forming an N+ region and P+ region in each of the N-well and P-well using dopants, while blocking portions of the N-well and P-well with blocks. The method further comprises in a second portion, adjacent to the first portion: forming the trench isolation structures using same CMOS processing steps as the trench isolation structures of the first portion; forming the contiguous N-well and P-well in the upper layer bounded by the trench isolation structures using same CMOS processing steps at the N-well and P-well in the first portion; and forming a single N+ region in the N-well and a single P+ region in the P-well using same CMOS processing steps as the N+ regions and P+ regions of the first portion, with portions of the N-well and P-well separating the single N+ region and the single P+ region.

In another aspect of the invention, a design structure tangibly embodied in a machine readable storage medium for designing, manufacturing, or testing an integrated circuit is provided. The design structure comprises the structures of the present invention. In further embodiments, a hardware description language (HDL) design structure encoded on a machine-readable data storage medium comprises elements that when processed in a computer-aided design system generates a machine-executable representation of the ESD protection devices, which comprises the structures of the present invention. In still further embodiments, a method in a computer-aided design system is provided for generating a functional design model of the ESD protection devices. The method comprises generating a functional representation of the structural elements of the ESD protection devices.

BRIEF DESCRIPTION OF THE SEVERAL VIEWS OF THE DRAWINGS

The present invention is described in the detailed description which follows, in reference to the noted plurality of drawings by way of non-limiting examples of exemplary embodiments of the present invention.

FIGS. 3b and 3c show cross sectional views of the bi-directional back-to-back stacked SCR for high-voltage pin ESD protection and respective processing steps of FIG. 3a;

FIG. 5a shows a top view of a bi-directional back-to-back stacked SCR for high-voltage pin ESD protection in accordance with an aspect of the invention;

FIGS. 5b and 5c show cross sectional views of the bi-directional back-to-back stacked SCR for high-voltage pin ESD protection and respective processing steps of FIG. 5a;

DETAILED DESCRIPTION

The invention relates to semiconductor structures and methods of manufacture and, more particularly, to bi-directional back-to-back stacked SCRs for high-voltage pin ESD protection, methods of manufacture and design structures. In more specific embodiments, the devices of the present invention are bi-directional back-to-back stacked symmetrical SCRs, each having PNP and NPN bipolar junctions and parallel diodes. Conventional back to back stacked diodes have very high clamping voltage, which is not advantageous to the ESD protection.

In operation (e.g., upon application of positive or negative voltage), the diodes in one SCR can be reverse biased effectively removing elements (diodes) from the circuit; while the diodes in the other SCR remain forward biased. In this way, a forward bias ESD protection path is created upon application of a voltage, which provides superior ESD protection. Also, advantageously, the bi-directional back-to-back stacked SCR maintains low breakdown voltage and low $R_{on}$, thereby providing superior ESD protection. The bi-directional back-to-back stacked SCR for high-voltage pin ESD protection is also not process sensitive, i.e., performance is not sensitive to changes in processing conditions, from one device to another.

Figure 1A:
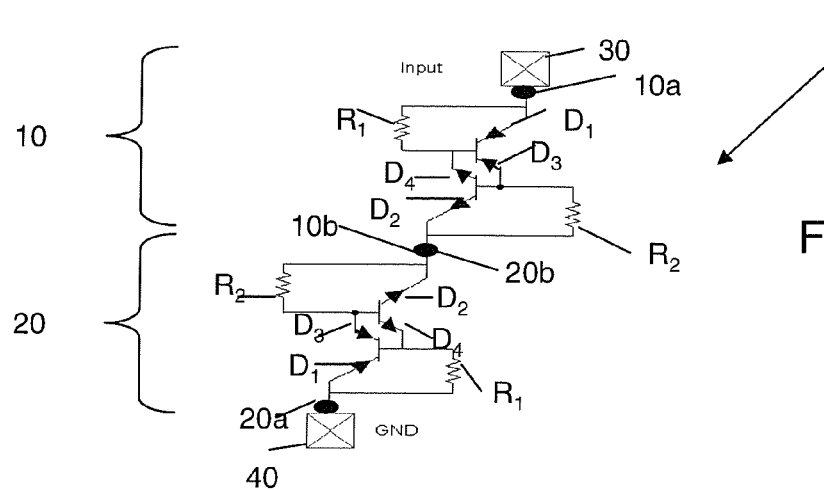
FIG. 1a shows a circuit diagram of a bi-directional back-to-back stacked SCR for high-voltage pin ESD protection in accordance with aspects of the present invention.

FIG. 1a shows a circuit diagram of a bi-directional back-to-back stacked SCR for high-voltage pin ESD protection in accordance with aspects of the present invention. The circuit 5 of FIG. 1 includes SCR 10 and SCR 20, placed in a back-to-back fashion. In embodiments, the SCR 10 and SCR 20 are symmetrical, each having, for example, NPN and PNP junctions and parallel diodes. The SCR 10 and SCR 20 have a high forward SCR trigger voltage and low P-well/N-well diode on resistance. The SCR 10 and SCR 20 work in either direction, in a forward biased mode. The SCR 10 and SCR 20 can be multiple stacked structures for arbitrary voltage levels, and may be integrated on a same chip or integrated circuit that includes the circuit to be protected.

More specifically, the SCR 10 is connected to an input 30 at its anode 10a and the SCR 20 is connected to ground 40 by its anode 20a. The SCR 10 and SCR 20 are connected together by their respective cathodes, 10b, 20b. The SCR 10 and SCR 20 each include resistors $R_1$ and $R_2$ in parallel with diodes $D_1$ and $D_2$, respectively, each having its forward direction towards the cathodes 10b, 20b of the respective SCR 10, 20. In embodiments, the diodes $D_1$ and $D_2$ can be, for example, a P-well diode and N-well diode, respectively. Additional diodes $D_3$ and $D_4$, respectively, are provided between the diodes $D_1$ and $D_2$ and resistors $R_1$ and $R_2$. The diodes $D_3$ and $D_4$ can be P-well/N-well junction diodes. In embodiments, the arrangement of the diodes can create a PNP or NPN bipolar transistor.

As discussed in further detail with reference to FIGS. 1b and 1c, the diodes $D_1$ and $D_2$ in the SCR 10 will reverse bias upon application of a negative voltage. Also, the diodes $D_1$ and $D_2$ in the SCR 20 will reverse bias upon application of a positive voltage. This will effectively deactivate circuit elements from the SCR.

Figure 1B:
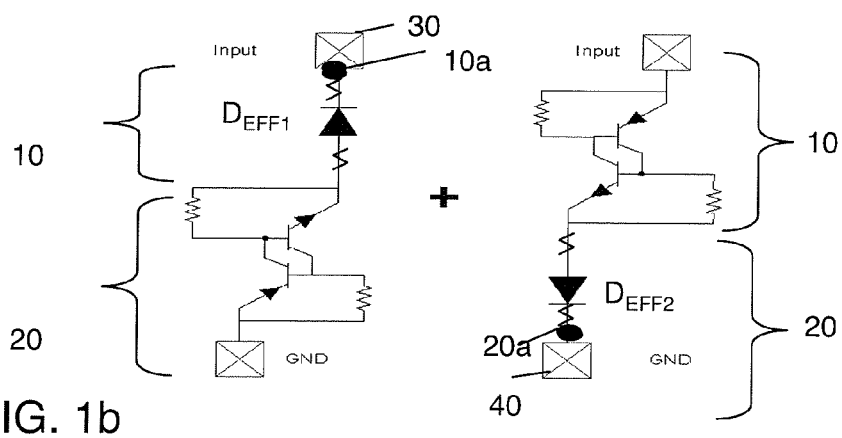
FIGS. 1b and 1c shows a representative circuit diagram of a bi-directional back-to-back stacked SCR for high-voltage pin ESD protection in accordance with an aspect of the invention.

More specifically, as shown in FIG. 1b, upon the application of a negative voltage, the diodes $D_3$ and $D_4$ in the SCR 10 become an effective diode $Deff_1$ between two resistors $R_1$ and $R_2$. The effective diode $Deff_1$ directs current towards the anode 10a of the SCR 10 (e.g., towards the input 30). This is the same direction as the current is through bipolar transistors in the SCR 20. The forward biased diode (effective diode $Deff_1$) conducts current at about 0.7 V. In this way, upon an application of negative voltage, the SCR 10 will be reversed biased and will not conduct current, whereas $Deff_1$ will conduct current, thus providing an effective ESD protection device.

Figure 1C:
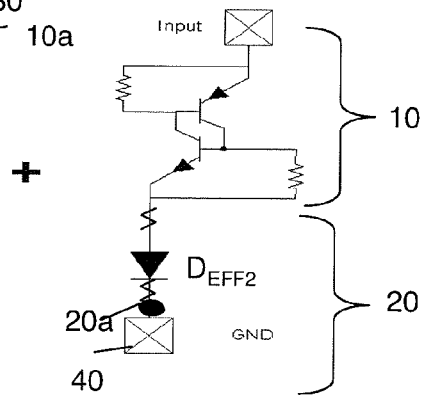

Similarly, as shown in FIG. 1c, upon the application of a positive voltage, the diodes $D_3$ and $D_4$ in the SCR 20 become an effective diode $Deff_2$ between two resistors $R_1$ and $R_2$. The effective diode $Deff_2$ directs current towards the anode 10a of the SCR 20 (e.g., towards the GND 40). This is the same direction as the bipolar transistors in the SCR 10. The forward biased diode (effective diode $Deff_2$) conducts current at about 0.7 V. In this way, upon an application of positive voltage, the SCR 20 will be reversed biased and not conduct current, whereas $Deff_2$ will conduct current, thus providing an effective ESD protection device.

Figure 2:
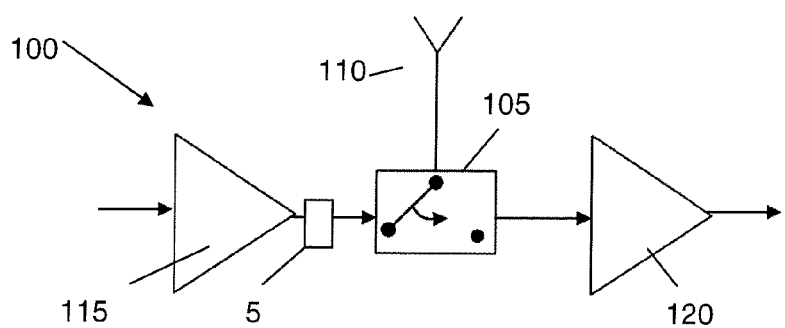
FIG. 2 shows an application of use for the bi-directional back-to-back stacked SCR in accordance with an aspect of the invention.

FIG. 2 shows an application of use for the bi-directional back-to-back stacked SCR for high-voltage pin ESD protection in accordance with an aspect of the invention. In embodiments, the ESD protection device of the present invention can be advantageously implemented into a RF switch which requires high input signal (+/−30 V), with low capacitance so as to not affect the signal and to achieve 8 kV ESD target levels.

More specifically, FIG. 2 shows a cellular telephone application using the circuitry of FIG. 1a. The cellular telephone 100 includes an RF switch 105 connected to an antenna 110. A power amplifier 115 is connected to output and the ESD protection device 5. The ESD protection device 5 is provided at an input to the RF switch 105 and, in embodiments, may be integrated on a same chip or integrated circuit that includes the RF switch 105. In this way, the ESD protection device 5 of the present invention can provide an ESD protection for an RF switch. Those of skill in the art should appreciate that the ESD protection device 5 of the present invention can also be integrated into and/or protect other devices or directly into switches, for example. A low amplifier input (LNA) 120 is connected to the RF switch 105.

Figure 3A:
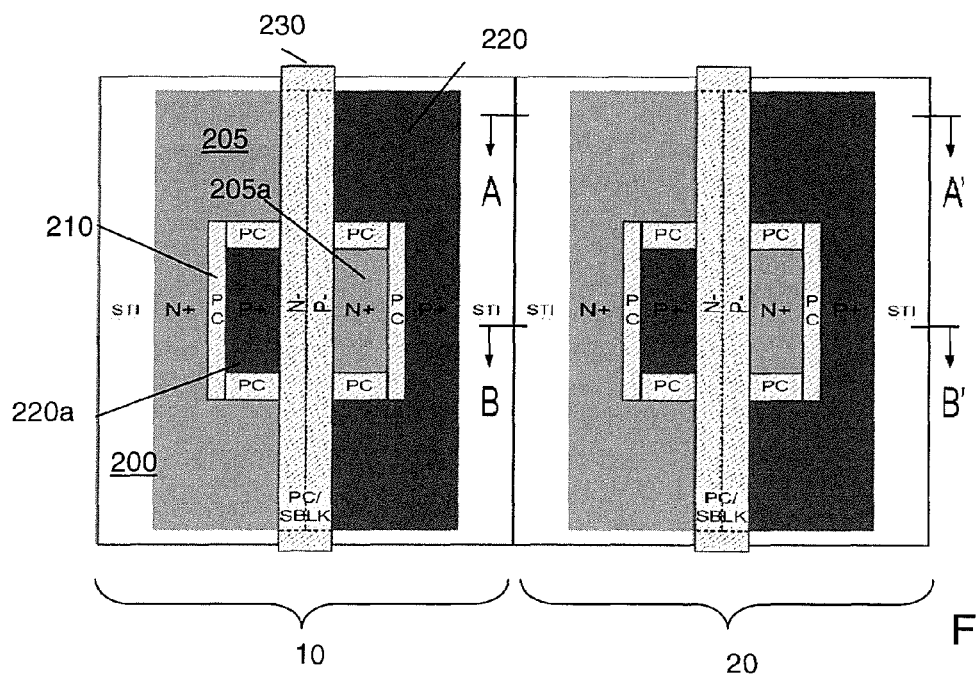
FIG. 3a shows a top view of a bi-directional back-to-back stacked SCR for high-voltage pin ESD protection in accordance with an aspect of the invention.
Figure 3B:
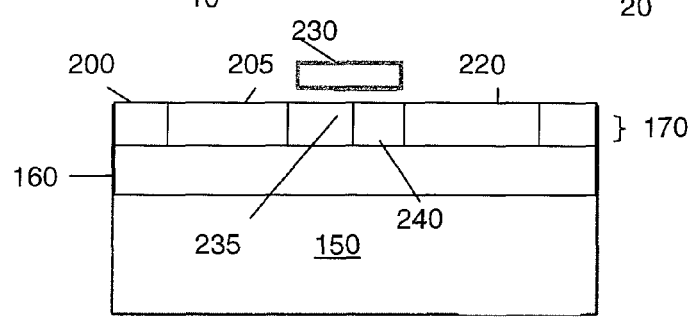
Figure 3C:
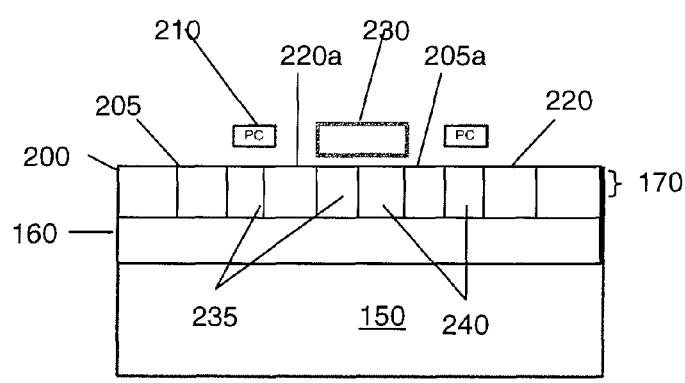

FIG. 3a shows a top view of a bi-directional back-to-back stacked SCR for high-voltage pin ESD protection in accordance with an aspect of the invention. FIGS. 3b and 3c show cross sectional views of the bi-directional back-to-back stacked SCR for high-voltage pin ESD protection and respective processing steps of FIG. 3a. The bi-directional back-to-back stacked SCR 5 includes SCR 10 and SCR 20, which are symmetrical. As SCR 10 and SCR 20 are identical (symmetrical), a discussion of SCR 10 will only be provided herein; although, one of skill in the art would readily understand that the description herein is equally applicable for both SCR 10 and SCR 20.

The SCR 10 includes a shallow trench isolation structure 200, surrounding N- and P-wells (covered by block 230), which can have similar widths. More specifically, at cross section A-A (e.g., diode) an N+ doped region 205 is adjacent (e.g., contiguous) (in direct contact with) an N-well (covered by block 230). The N-well is adjacent (in direct contact with) a P-well (also covered by block 230). The P-well is adjacent (in direct contact with) a P+ region 220. The P+ region 200 is adjacent (in direct contact with) to the shallow trench isolation structure 200.

At cross section B-B (e.g., SCR), the N+ doped region 205 is adjacent (in direct contact with) an N-well (covered by block 210). The N-well is adjacent (in direct contact with) a P+ region 220a. The P+ region 220a is adjacent (in direct contact with) the N-well (covered by block 230), which is adjacent (in direct contact with) the P-well (also covered by block 230). The P-well is adjacent (in direct contact with) a N+ region 205a. The N+ region 205a is adjacent (in direct contact with) a P-well (covered by block 210). The P-well (covered by block 210) is adjacent (in direct contact with) the P+ region 220. The P+ region 200 is adjacent (in direct contact with) the shallow trench isolation structure 200.

FIG. 3b shows a cross sectional view along A-A of the bi-directional back-to-back stacked SCR of FIG. 3a. FIG. 3c shows a cross sectional view along B-B of the bi-directional back-to-back stacked SCR of FIG. 3a. FIG. 3c is described herein with respect to the fabrication processes to build the SCR of the present invention, which are equally applicable for the structure shown in FIG. 3b. The structures of FIGS. 3b and 3c can be fabricated at the same time using same CMOS fabrication processes.

Referring to FIG. 3c, the structure starts with a substrate on insulator including, for example, a conventional wafer 150, an insulator layer 160 such as, for example, buried oxide and an upper layer generally noted at reference numeral 170. The upper layer 170 can be a substrate layer such as, for example, silicon. In embodiments, the shallow trench isolation structures 200 are fabricated using conventional lithographic and etching processes in the upper layer 170. For example, a photoresist can be provided on the substrate 170, and exposed to light to form a pattern (holes) exposing portions of the substrate 170. A pattern of trenches is then etched into the substrate 170 using conventional etching processes such as, for example, reactive ion etching. The photoresist can be stripped and an insulator material such as, for example, oxide is deposited into the pattern of trenches. A planarization process can then follow such as, for example, chemical mechanical polishing.

N-wells 235 and P-wells 240 are formed in the substrate 170 using conventional doping processes. In embodiments, the N-wells 235 can be formed by phosphorous doping and the P-wells 240 can be formed by arsenic or boron doping, using known concentrations and doses. Thereafter, N+ regions 205, 205a and P+ regions 220a, 220 are formed in the substrate 170 using conventional dopants, while blocking the N-wells 235 and P-wells 240 with blocks 210 and 230, respectively. The N+ regions 205, 205a and P+ regions 220a, 220 can be formed using conventional dopants such as, for example, phosphorous (for N+ regions) and arsenic or boron (for P+ regions) at known concentrations and doses. In embodiments, the N+ regions 205, 205a and P+ regions 220a, 220 (much like the N-wells and P-wells) extend to the insulator layer 160.

Figure 4:
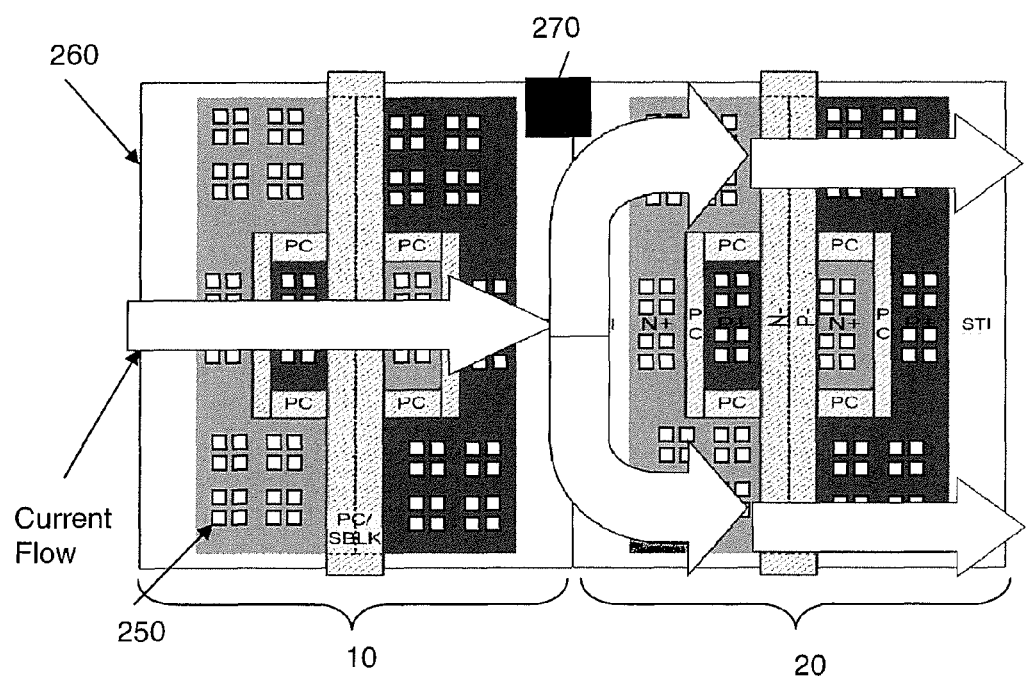
FIG. 4 shows a top view of the bi-directional back-to-back stacked SCR for high-voltage pin ESD protection of FIG. 3a-3c, with wiring level in accordance with an aspect of the invention.

FIG. 4 shows a top view of the bi-directional back-to-back stacked SCR for high-voltage pin ESD protection of FIG. 3a-3c, with wiring level in accordance with an aspect of the invention. FIG. 4 also shows the current flow from input to ground. In FIG. 4 contacts 250 are connected between a metal wiring layer 260 and the N+ regions 205, 205a, P+ regions 220a, 220, N-wells 235 and P-wells 240. The contacts 250 can be, for example, tungsten, provided within a dielectric layer 270 that provides insulation between the wiring layer 260 and underlying P-/N-wells and N+/P+ regions. In embodiments, the wiring layer 260 can be, for example, copper.

FIG. 5a shows a top view of a bi-directional back-to-back stacked SCR for high-voltage pin ESD protection in accordance with an aspect of the invention. FIGS. 5b and 5c show cross sectional views of the bi-directional back-to-back stacked SCR for high-voltage pin ESD protection and respective processing steps of FIG. 5a. The bi-directional back-to-back stacked SCR 5 includes SCR 10 and SCR 20, which are symmetrical. Much like the above discussion, as SCR 10 and SCR 20 are identical (symmetrical), a discussion of SCR 10 will only be provided herein; although, one of skill in the art would readily understand that the description herein is equally applicable for both SCR 10 and SCR 20.

The SCR 10 includes a trench isolation structure 500 surrounding N+ doped regions and P+ doped regions. More specifically, at cross section A-A (e.g., diode), the trench isolation structure 500 is adjacent (in direct contact with) N+ region 505. The N+ region 505 (formed in a N-well) is separated from P+ region 510 (formed in a P-well) by a shallow trench isolation structure 502. In embodiments, the P-well and the N-well can have similar widths. At cross section B-B (e.g., SCR), the trench isolation structure 500 is adjacent (in direct contact with) the N+ region 505. The N+ region 505 (formed in an N-well) is separated from P+ region 510a (formed in the N-well) by a shallow trench isolation structure 502. The P+ region 510a is separated from N+ region 505a (formed in the N-well) by the shallow trench isolation structure 502. The N+ region 505a (formed in the N-well) is separated from P+ region 510 (formed in the N-well) by a shallow trench isolation structure 502.

FIG. 5b shows a cross sectional view along A-A of the bi-directional back-to-back stacked SCR of FIG. 5a. FIG. 5c shows a cross sectional view along B-B of the bi-directional back-to-back stacked SCR of FIG. 5a. FIG. 5c is described herein with respect to the fabrication processes to build the SCR 10 of the present invention, which are equally applicable for the structure shown in FIG. 5b. The structures of FIGS. 5b and 5c can be fabricated at the same time using same CMOS fabrication processes.

Referring to FIG. 5c, the structure starts with a substrate on insulator including, for example, a conventional wafer 150 and an insulator layer 160 such as, for example, buried oxide. An upper layer generally noted at reference numeral 170 is an upper substrate film such as, for example, silicon. In embodiments, the trench isolation structures 500 and shallow trench isolation structures 502 are fabricated using conventional lithographic and etching processes. In embodiments, the trench isolation structures 500 and shallow trench isolation structures 502 are fabricated in different fabrication processes, preferably with the trench isolation structures 500 being fabricated first.

For both the trench isolation structures 500 and shallow trench isolation structures 502, a photoresist can be provided on the substrate 170, and exposed to light to form a pattern (holes) exposing portions of the substrate 170. A pattern of trenches is then etched into the substrate 170 using conventional etching processes such as, for example, reactive ion etching. The photoresist can be stripped and an insulator material such as, for example, oxide can then be deposited into the pattern of trenches. A planarization process can then follow such as, for example, chemical mechanical polishing.

N-wells 235 and P-wells 240 are then formed in the substrate using conventional doping processes. In embodiments, the N-wells 235 can be formed by phosphorous doping and the P-wells 240 can be formed by arsenic or boron doping, using known concentrations and doses. In embodiments, the N-wells 235 and P-wells 240 are isolated from by the trench isolation structures 500.

Thereafter, N+ regions 505, 505a and P+ regions 510, 510a are formed in the substrate 170 using conventional dopants, while blocking the N-wells 235 and P-wells 240 with blocks. The N+ regions 505, 505a and P+ regions 510a, 510 can be formed using conventional dopants such as, for example, phosphorous (for N+ regions) and arsenic or boron (for P+ regions) at known concentrations and doses. In embodiments, the N+ regions 505, 505a and P+ regions 510a, 510 do not extend to the insulator layer 160 and are separated by the shallow trench isolation structures 502; whereas, the N-wells 235 and P-wells 240 extend to the insulator layer 160.

Figure 6:
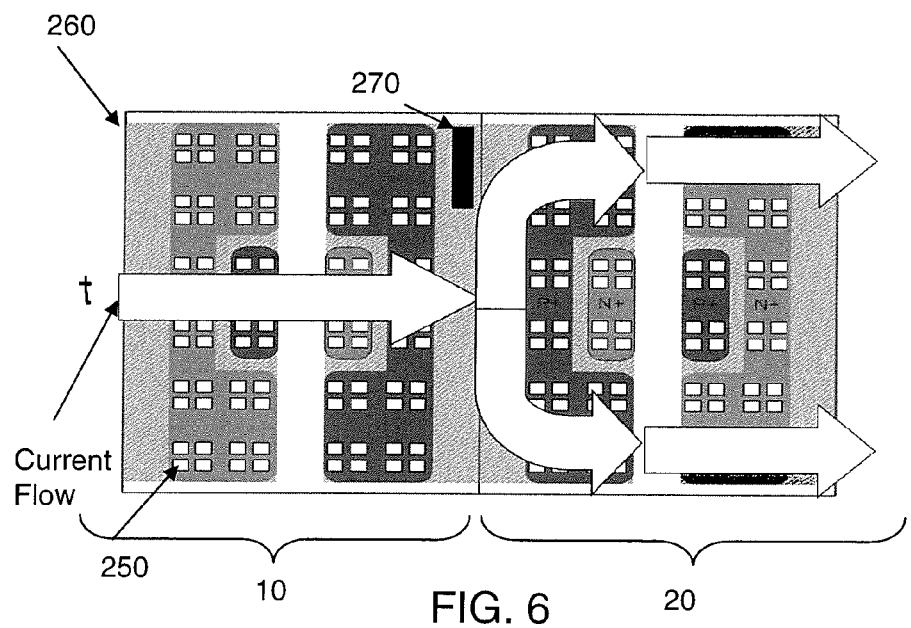
FIG. 6 shows a top view of the bi-directional back-to-back stacked SCR for high-voltage pin ESD protection of FIGS. 5a-5c, with wiring level in accordance with an aspect of the invention.

FIG. 6 shows a top view of the bi-directional back-to-back stacked SCR for high-voltage pin ESD protection of FIGS. 5a-5c, with wiring level in accordance with an aspect of the invention. FIG. 6 also shows the current flow from input to ground. In FIG. 6 contacts 250 are connected between a metal wiring layer 260 and the N+ regions 505, 505a and P+ regions 520a, 520. The contacts 250 can be, for example, tungsten, provided within a dielectric layer 270 that provides insulation between the wiring layer 260 and underlying P-/N-wells and N+/P+ regions. In embodiments, the wiring layer 260 can be, for example, copper.

Figure 7:
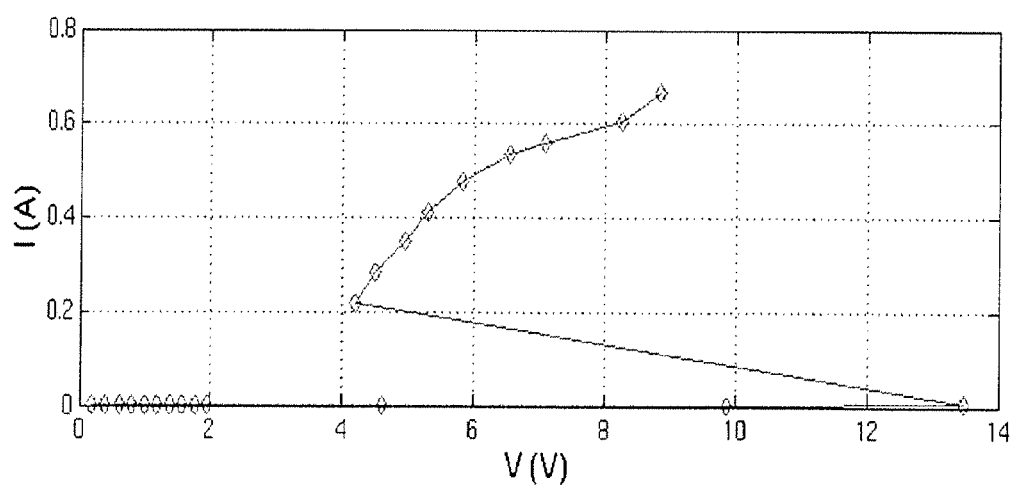
FIG. 7 shows a graph of ESD test results of breakdown triggered SCR in accordance with an aspect of the invention.

FIG. 7 shows a graph of ESD test results of breakdown triggered SCR in accordance with an aspect of the invention. In particular, FIG. 7 shows a graph of current vs. voltage, with a holding voltage of an SCR being at about 4 volts. This shows that the SCR of the present invention can provide effective ESD protection in devices such as, for example, RF switches.

Figure 8:
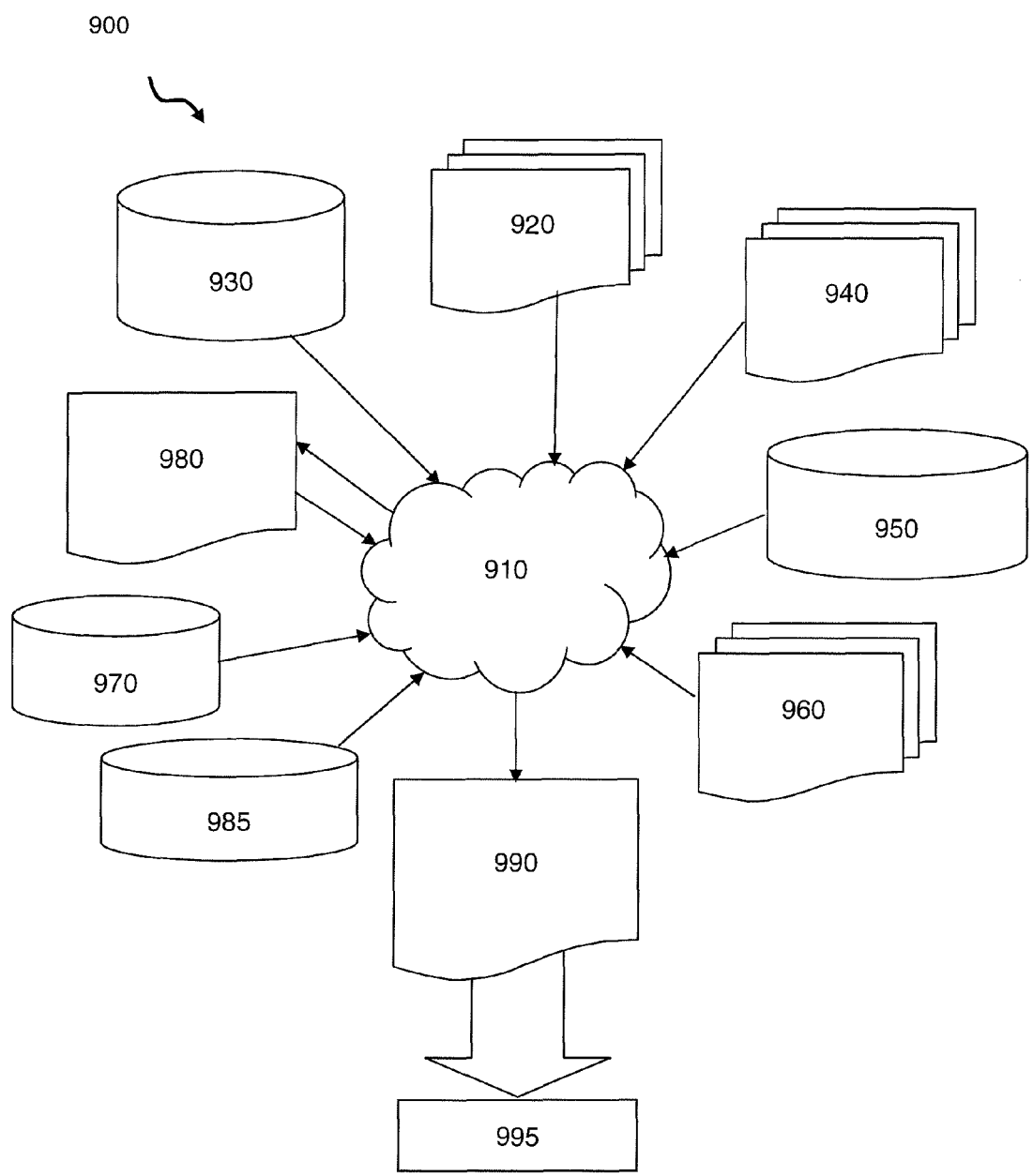
FIG. 8 is a flow diagram of a design process used in semiconductor design, manufacture, and/or test.

FIG. 8 is a flow diagram of a design process used in semiconductor design, manufacture, and/or test. FIG. 8 shows a block diagram of an exemplary design flow 900 used for example, in semiconductor IC logic design, simulation, test, layout, and manufacture. Design flow 900 includes processes, machines and/or mechanisms for processing design structures or devices to generate logically or otherwise functionally equivalent representations of the design structures and/or devices described above and shown in FIGS. 1a-6. The design structures processed and/or generated by design flow 900 may be encoded on machine-readable transmission or storage media to include data and/or instructions that when executed or otherwise processed on a data processing system generate a logically, structurally, mechanically, or otherwise functionally equivalent representation of hardware components, circuits, devices, or systems. Machines include, but are not limited to, any machine used in an IC design process, such as designing, manufacturing, or simulating a circuit, component, device, or system. For example, machines may include: lithography machines, machines and/or equipment for generating masks (e.g. e-beam writers), computers or equipment for simulating design structures, any apparatus used in the manufacturing or test process, or any machines for programming functionally equivalent representations of the design structures into any medium (e.g. a machine for programming a programmable gate array).

Design flow 900 may vary depending on the type of representation being designed. For example, a design flow 900 for building an application specific IC (ASIC) may differ from a design flow 900 for designing a standard component or from a design flow 900 for instantiating the design into a programmable array, for example a programmable gate array (PGA) or a field programmable gate array (FPGA) offered by Altera® Inc. or Xilinx® Inc.

FIG. 8 illustrates multiple such design structures including an input design structure 920 that is preferably processed by a design process 910. Design structure 920 may be a logical simulation design structure generated and processed by design process 910 to produce a logically equivalent functional representation of a hardware device. Design structure 920 may also or alternatively comprise data and/or program instructions that when processed by design process 910, generate a functional representation of the physical structure of a hardware device. Whether representing functional and/or structural design features, design structure 920 may be generated using electronic computer-aided design (ECAD) such as implemented by a core developer/designer. When encoded on a machine-readable data transmission, gate array, or storage medium, design structure 920 may be accessed and processed by one or more hardware and/or software modules within design process 910 to simulate or otherwise functionally represent an electronic component, circuit, electronic or logic module, apparatus, device, or system such as those shown in FIGS. 1a-6. As such, design structure 920 may comprise files or other data structures including human and/or machine-readable source code, compiled structures, and computer-executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 910 preferably employs and incorporates hardware and/or software modules for synthesizing, translating, or otherwise processing a design/simulation functional equivalent of the components, circuits, devices, or logic structures shown in FIGS. 1a-6 to generate a netlist 980 which may contain design structures such as design structure 920. Netlist 980 may comprise, for example, compiled or otherwise processed data structures representing a list of wires, discrete components, logic gates, control circuits, I/O devices, models, etc. that describes the connections to other elements and circuits in an integrated circuit design. Netlist 980 may be synthesized using an iterative process in which netlist 980 is resynthesized one or more times depending on design specifications and parameters for the device. As with other design structure types described herein, netlist 980 may be recorded on a machine-readable data storage medium or programmed into a programmable gate array. The medium may be a nonvolatile storage medium such as a magnetic or optical disk drive, a programmable gate array, a compact flash, or other flash memory. Additionally, or in the alternative, the medium may be a system or cache memory, buffer space, or electrically or optically conductive devices and materials on which data packets may be transmitted and intermediately stored via the Internet, or other networking suitable means.

Design process 910 may include hardware and software modules for processing a variety of input data structure types including netlist 980. Such data structure types may reside, for example, within library elements 930 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 940, characterization data 950, verification data 960, design rules 970, and test data files 985 which may include input test patterns, output test results, and other testing information. Design process 910 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 910 without deviating from the scope and spirit of the invention. Design process 910 may also include modules for performing standard circuit design processes such as timing analysis, verification, design rule checking, place and route operations, etc.

Design process 910 employs and incorporates logic and physical design tools such as HDL compilers and simulation model build tools to process design structure 920 together with some or all of the depicted supporting data structures along with any additional mechanical design or data (if applicable), to generate a second design structure 990.

Design structure 990 resides on a storage medium or programmable gate array in a data format used for the exchange of data of mechanical devices and structures (e.g. information stored in a IGES, DXF, Parasolid XT, JT, DRG, or any other suitable format for storing or rendering such mechanical design structures). Similar to design structure 920, design structure 990 preferably comprises one or more files, data structures, or other computer-encoded data or instructions that reside on transmission or data storage media and that when processed by an ECAD system generate a logically or otherwise functionally equivalent form of one or more of the embodiments of the invention shown in FIGS. 1a-6. In one embodiment, design structure 990 may comprise a compiled, executable HDL simulation model that functionally simulates the devices shown in FIGS. 1a-6.

Design structure 990 may also employ a data format used for the exchange of layout data of integrated circuits and/or symbolic data format (e.g. information stored in a GDSII (GDS2), GL1, OASIS, map files, or any other suitable format for storing such design data structures). Design structure 990 may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce a device or structure as described above and shown in FIGS. 1a-6. Design structure 990 may then proceed to a stage 995 where, for example, design structure 990: proceeds to tape-out, is released to manufacturing, is released to a mask house, is sent to another design house, is sent back to the customer, etc.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims, if applicable, are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principals of the invention and the practical application, and to enable others of ordinary skill in the art to understand the invention for various embodiments with various modifications as are suited to the particular use contemplated. Accordingly, while the invention has been described in terms of embodiments, those of skill in the art will recognize that the invention can be practiced with modifications and in the spirit and scope of the appended claims.

What is claimed:

1. A structure comprising:
   a silicon controlled rectifier comprising:
      an N+ region and a P+ region formed in an N-well;
      an N+ region and a P+ region formed in a P-well which is adjacent to the N-well; and
      a diode comprising a portion of the N+ region formed in the N-well located adjacent to a portion of the P+ region formed in the P-well,
      wherein the N+ region and the P+ region in the N-well are symmetrical with respect to the N+ region and the P+ region in the P-well.

2. The structure of claim 1, wherein the N+ and P+ regions formed in the P-well and N-well extend to a buried insulator layer in a substrate.

3. The structure of claim 2, wherein the P-well and N-well extend to a buried insulator layer in the substrate.

4. The structure of claim 3, wherein the N+ and P+ regions formed in the P-well and N-well are separated by portions of the P-well and N-well, respectively.

5. The structure of claim 1, wherein the N+ and P+ regions formed in the P-well and N-well extend partially into an upper layer of a substrate on a buried insulator layer.

6. The structure of claim 5, wherein the N+ and P+ regions formed in the P-well and N-well are separated by shallow isolation structures.

7. The structure of claim 6, wherein the P-well and N-well are bounded by an isolation structure.

8. The structure of claim 1, wherein the N-well and P-well are contiguous.

9. The structure of claim 1, wherein the N-well and P-well have a similar width.

10. The structure of claim 1, wherein
    the N+ region and the P+ region formed in the N-well comprise a first structure;
    the N+ region and the P+ region formed in the P-well comprise a second structure adjacent to the first structure;
    the first structure and the second structure are arranged back-to-back; and the back-to-back arrangement of the first structure and the second structure provides bi-directional ESD protection to the silicon controlled rectifier.

11. The structure of claim 1, wherein:
the N+ region and the P+ region formed in an N-well are formed entirely within the N-well; and
the N+ region and the P+ region formed in a P-well are formed entirely within the P-well.

12. The structure of claim 1, wherein:
the N+ region and the P+ region formed in the N-well comprise a first structure;
the N+ region and the P+ region formed in the P-well comprise a second structure; and
the first structure and the second structure are symmetric structures arranged back-to-back.

13. The structure of claim 1, further comprising:
a silicon on insulator (SOI) substrate;
trench isolation (TI) structures in an upper layer of the SOI;
a first shallow trench isolation (STI) structure between the N+ region and the P+ region formed in the N-well;
a second STI structure between the N+ region and the P+ region formed in the P-well; and
a third STI structure between the P+ region formed in the N-well and the N+ region formed in the P-well,
wherein:
the N-well and the P-well are on the SOI substrate;
the N-well and the P-well are contiguous; and
the N-well and the P-well are bounded by the TI structures.

14. A method, comprising:
in a first portion:
forming trench isolation structures using lithographic, etching and deposition processes in an upper layer of a silicon on insulator substrate (SOI);
forming contiguous a N-well and P-well in the upper layer bounded by the trench isolation structures; and
forming an N+ region and P+ region in each of the N-well and P-well using dopants, while blocking portions of the N-well and P-well with blocks; and in a second portion, adjacent to the first portion:
forming the trench isolation structures using same CMOS processing steps as the trench isolation structures of the first portion;
forming the contiguous N-well and P-well in the upper layer bounded by the trench isolation structures using same CMOS processing steps at the N-well and P-well in the first portion; and
forming a single N+ region in the N-well and a single P+ region in the P-well using same CMOS processing steps as the N+ regions and P+ regions of the first portion, with portions of the N-well and P-well separating the single N+ region and the single P+ region.

15. The method of claim 14, wherein the N+ region and P+ region in each of the N-well and P-well are isolated by shallow isolation structures formed in the upper layer.

16. A design structure tangibly embodied in a machine readable device for designing, manufacturing, or testing an integrated circuit, the design structure comprising:
a silicon controlled rectifier comprising:
an N+ region and a P+ region formed entirely within an N-well;
an N+ region and a P+ region formed entirely within a P-well which is adjacent to the N-well; and
a diode comprising a portion of the N+ region formed in the N-well located adjacent to a portion of the P+ region formed in the P-well.

17. The design structure of claim 16, wherein the design structure comprises a netlist.

18. The design structure of claim 16, wherein the design structure resides on storage medium as a data format used for the exchange of layout data of integrated circuits.

19. The design structure of claim 16, wherein the design structure resides in a programmable gate array.

20. The design structure of claim 16, wherein the N+ region and the P+ region in the N-well are symmetrical with respect to the N+ region and the P+ region in the P-well.

* * * * *